(12) United States Patent
Chen

(10) Patent No.: US 8,766,451 B2
(45) Date of Patent: Jul. 1, 2014

(54) CHIP PACKAGING STRUCTURE

(75) Inventor: Chin-Yung Chen, Daxi Township, Taoyuan County (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 127 days.

(21) Appl. No.: 13/435,770

(22) Filed: Mar. 30, 2012

(65) Prior Publication Data

US 2012/0248619 A1  Oct. 4, 2012

(30) Foreign Application Priority Data

Mar. 31, 2011   (TW) .............................. 100111234 A

(51) Int. Cl.
*H01L 23/48*   (2006.01)
*H01L 23/52*   (2006.01)
*H01L 29/40*   (2006.01)

(52) U.S. Cl.
USPC ............ 257/773; 257/775; 257/691; 257/692

(58) Field of Classification Search
USPC .................................. 257/773, 775, 691, 692
See application file for complete search history.

(56) References Cited

U.S. PATENT DOCUMENTS

| 5,534,728 A * | 7/1996 | Kim et al. ..................... 257/692 |
| 8,247,903 B2 * | 8/2012 | Kodera ......................... 257/758 |
| 2010/0193960 A1 * | 8/2010 | Mashita et al. ............... 257/773 |
| 2011/0080550 A1 * | 4/2011 | Higuchi et al. ............... 349/150 |

* cited by examiner

*Primary Examiner* — David Zarneke

(57) ABSTRACT

A chip packaging structure includes a flexible plate, a chip, and a plurality of leads. The chip is disposed on the flexible plate. A first boundary and a second boundary are defined on the flexible plate. The first boundary is located between the chip and the second boundary. A first area is formed between the first boundary and the chip. A second area is formed between the first boundary and the second boundary. The chip includes a plurality of signal conducting points and a plurality of non-signal conducting points. The plurality of leads are disposed on the flexible plate and include a plurality of signal leads and a plurality of non-signal leads. The width of the non-signal lead is smaller than the width of the signal lead extending out of the second boundary.

10 Claims, 5 Drawing Sheets

CHIP PACKAGING STRUCTURE

BACKGROUND OF THE INVENTION

1. Field of the Invention

This invention generally relates to a chip packaging structure. More particularly, this invention relates to a chip packaging structure for coupling with an external circuit having a plurality of signal conducting legs.

2. Description of the Prior Art

The trend of development of electronic products is to make the product having characteristics such as smaller size, higher transfer speed, and higher pin count. The evolution of the packaging technique of a chip, including the driving chip of the liquid crystal display, basically follows this trend. Among the packaging techniques, a Chip On Film (COF) process is able to make the electronic product have the above characteristics and can be used on a flexible circuit board. Therefore, the COF process is a suitable packaging technique for the driving chip of the liquid crystal display.

In a flip chip packaging process, a chip is overturned and mounted face downward on a substrate via metal conductors. Since the chip is fixed on the film and merely electrically coupled with the flexible substrate via metal conductors, the flip chip process is called COF packaging process when it is applied to the flexible substrate. However, as the number of conducting points of the driving chip of the liquid crystal display increases, the distance between the conducting points becomes smaller, resulting in a narrower lead that is connected to the conducting point. Consequently, the leads in the stress area break more easily when the flexible substrate is bent under a force.

FIG. 1 is a schematic view of a conventional chip packaging structure. The chip packaging structure 80 includes a flexible plate 10, a chip 30, and a plurality of leads 50. The chip 30 includes a plurality of non-signal conducting points 31 and a plurality of signal conducting points 32. The plurality of leads 50 are disposed on the flexible plate 10 and include a plurality of non-signal leads 51 and a plurality of signal leads 52. The plurality of non-signal leads 51 respectively extend from the plurality of non-signal conducting points 31 and outwardly from the chip 30. The plurality of signal leads 52 respectively extend from the plurality of non-signal conducting points 31 and outwardly from the chip 30. The non-signal leads 51 are so called "Dummy Leads" since no signal is transmitted thereon. In other words, outside the chip 300, the non-signal leads 51 substantially "occupy" a certain space. The conventional chip packaging structure is still improvable.

SUMMARY OF THE INVENTION

It is an object of one or more embodiments to provide a chip packaging structure for coupling with an external circuit having a plurality of signal conducting legs, wherein the chip packaging structure is more bent-enduring.

The chip packaging structure of the present invention includes a flexible plate, a chip, and a plurality of leads. The chip is disposed on the flexible plate. A first boundary and a second boundary are defined on the flexible plate. The first boundary is located between the chip and the second boundary. A first area is formed between the first boundary and the chip. A second area is formed between the first boundary and the second boundary. The chip includes a plurality of signal conducting points and a plurality of non-signal conducting points. The plurality of leads are disposed on the flexible plate and include a plurality of signal leads and a plurality of non-signal leads. The plurality of non-signal leads respectively extend out to the first boundary from the plurality of non-signal conducting points and selectively extend to the second area. The plurality of signal leads respectively extend out of the second boundary from the plurality of signal conducting points and connect with a plurality of signal conducting legs. The width of the non-signal lead is smaller than or equal to the width of the signal lead in the second area. The width of the signal lead in the first area is smaller than or equal to the width of the signal lead in the second area. The width of the signal lead in the second area is smaller than the width of the signal lead extending out of the second boundary.

The plurality of non-signal leads and the plurality of signal leads are equally distributed in the first area, wherein the width of the non-signal lead and the width of the signal lead are the same in the first area. The width of the signal lead extending out of second boundary is larger than 22 μm. At least one of the plurality of the signal leads has a turning part after extending out of the second boundary, wherein the signal lead before the turning part and the signal lead after the turning part include a turning angle.

In an embodiment of the present invention, a third boundary is defined on the flexible plate, wherein the third boundary is located between the chip and the second boundary. The chip packaging structure further includes an insulating layer, wherein the insulating layer at least partially covers the plurality of leads from the third boundary and outward the chip. The third boundary is located between the first boundary and the second boundary. The distance between the second boundary and the third boundary is larger than 200 μm. In yet another embodiment of the present invention, a third boundary is defined outside the second boundary on the flexible plate. The chip packaging structure further includes an insulating layer, wherein the insulating layer at least partially covers the plurality of leads from the third boundary and outward the chip.

DETAILED DESCRIPTION

The chip packaging structure of the present invention is for coupling with an external circuit having a plurality of signal conducting legs. More particularly, as the embodiment shown in FIG. 2, the chip packaging structure 800 of the present invention is a COF packaging structure, which is preferably but not limited to coupled with a plurality of signal conducting legs of a printed circuit board 200 and a display panel 400.

Figure 1:
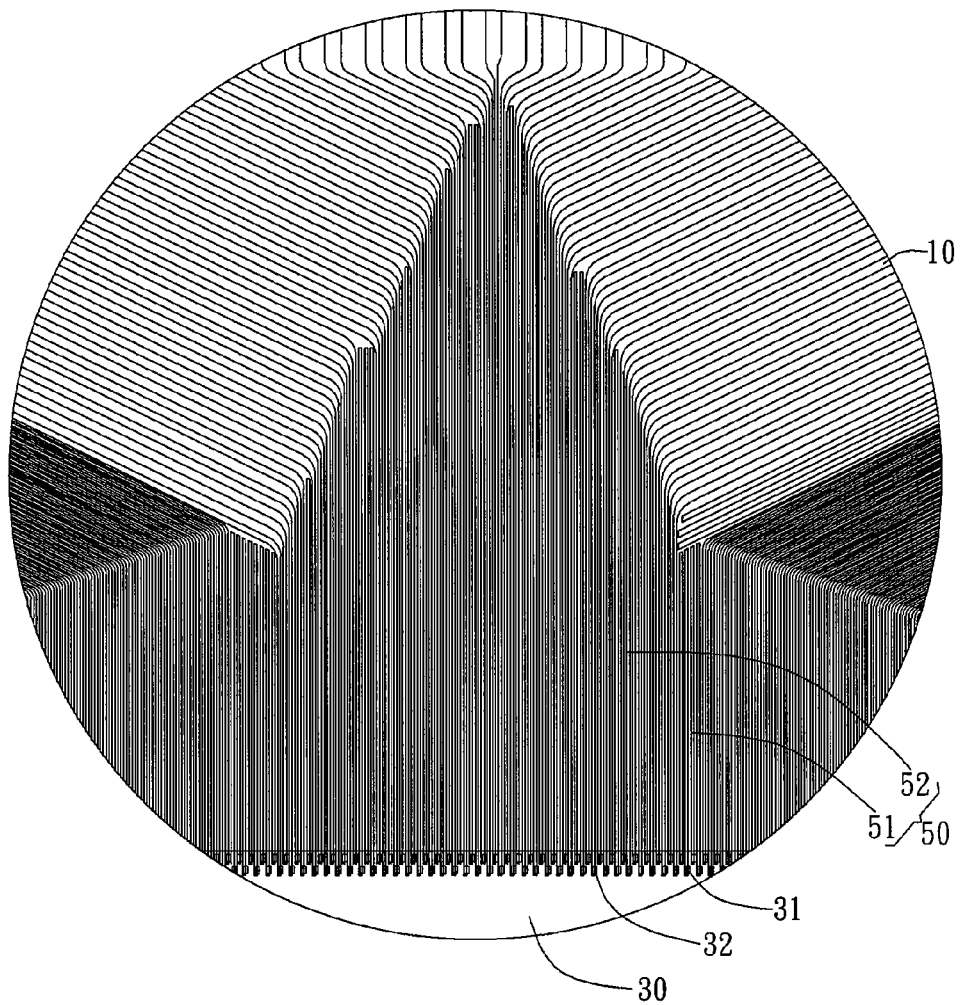
FIG. 1 is schematic view of prior arts.
Figure 2:
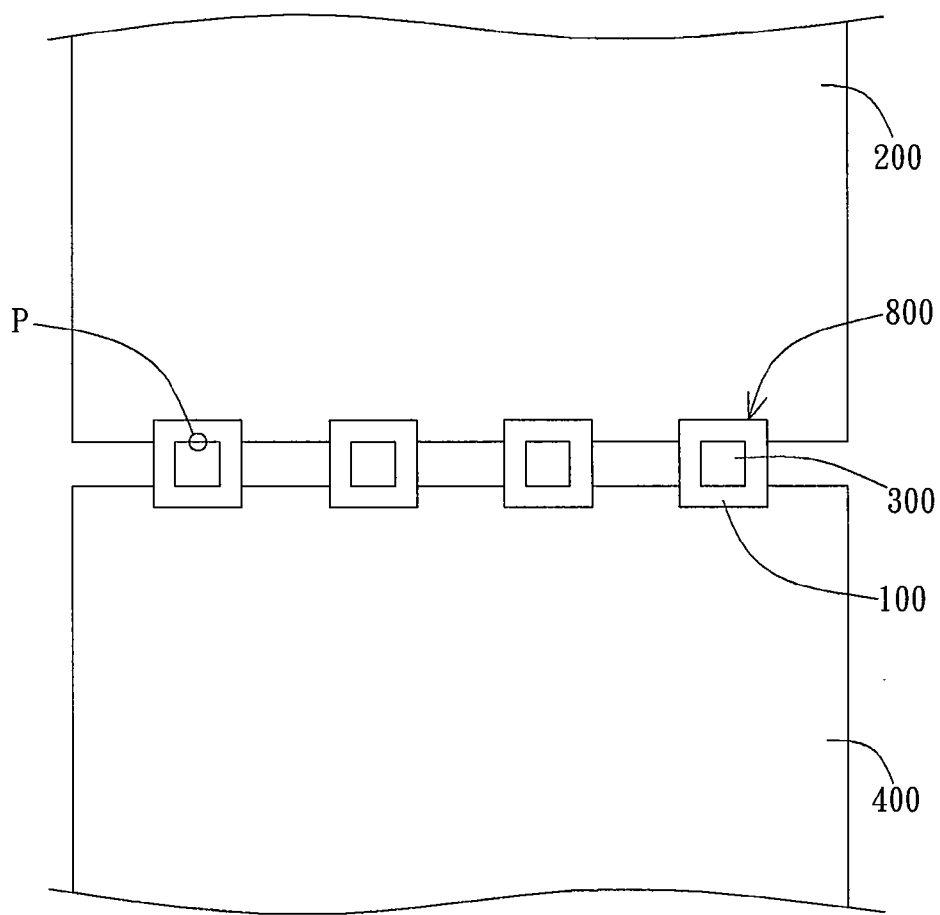
FIG. 2 is schematic view of embodiment of the present invention.
Figure 3:
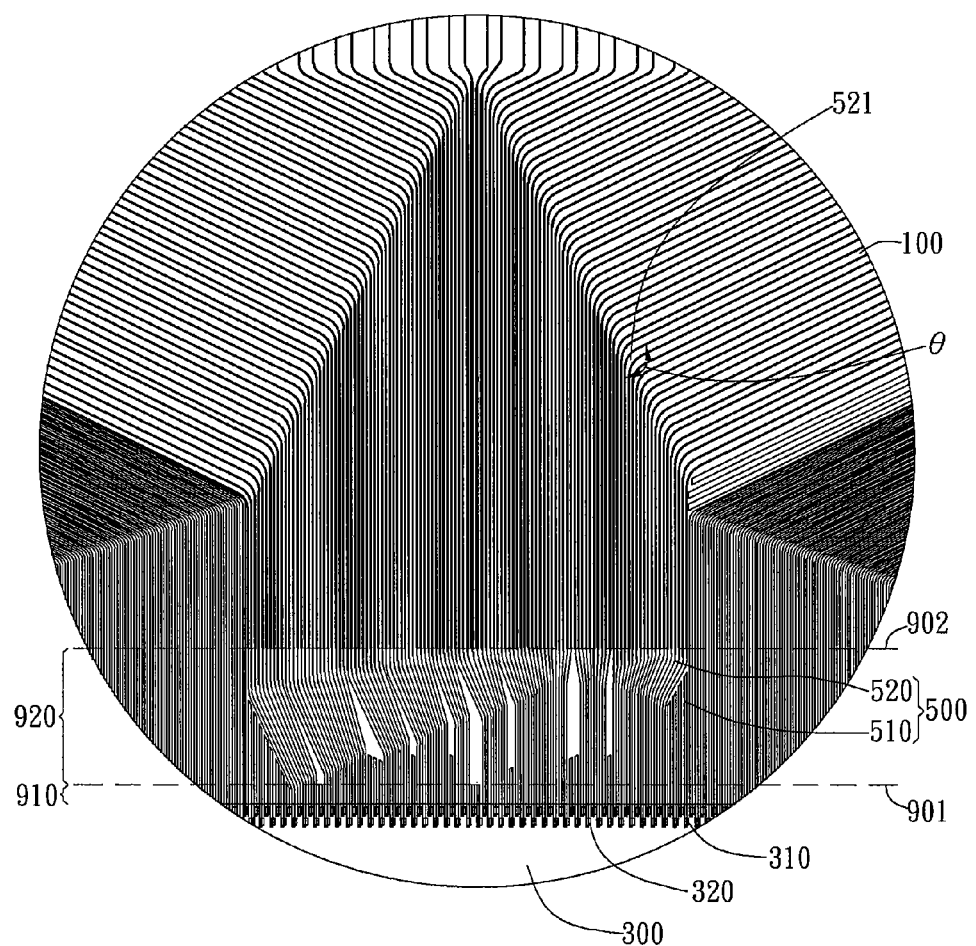
FIG. 3 is schematic view of preferred embodiment of the present invention.

FIG. 3 is an enlarged view of the P portion shown in FIG. 2. As the preferred embodiment shown in FIG. 3, the chip packaging structure 800 of the present invention includes a flexible plate 100, a chip 300, and a plurality of leads 500. The flexible plate 100 can be a plate having flexibility such as a polyimide plate. The chip 300 is disposed on the flexible plate 100. A first boundary 901 and a second boundary 902 are defined on the flexible plate 100. The first boundary 901 is located between the chip 300 and the second boundary 902. A first area 910 is formed between the first boundary 901 and the chip 300. A second area 920 is formed between the first boundary 901 and the second boundary 902. In other words, the distance between the first boundary 901 and the chip 300 is smaller than the distance between the second boundary 902 and the chip 300. In a preferred embodiment, the first boundary 901 is parallel to the fringe of the chip 300. In different embodiments, however, the first boundary 901 is not limited to be parallel to the fringe of the chip 300 and could be in different shapes according to the design requirement. The secondary boundary 902 does not intersect the first boundary 901. In a preferred embodiment, the second boundary 902 is parallel to the fringe of the chip 300. In different embodiments, however, the second boundary 902 is not limited to be parallel to the fringe of the chip 300 and could be in different shapes according to the design requirement.

As the preferred embodiment shown in FIG. 3, the chip 300 includes a plurality of non-signal conducting points 310 and a plurality of signal conducting points 320. In a preferred embodiment, the plurality of non-signal conducting points 310 and the plurality of signal conducting points 320 include conducting bumps, wherein the bumps are preferably formed by metal materials such as gold, silver, copper, iron, tin, lead, or the alloy thereof.

As the preferred embodiment shown in FIG. 3, plurality of leads 500 are disposed on the flexible plate 100, wherein the plurality of leads 500 include a plurality of non-signal leads 510 and a plurality of signal leads 520. The plurality of non-signal leads 510 respectively extend out to the first boundary 901 from the plurality of non-signal conducting points 310 and selectively extend to the second area 920. The plurality of signal leads respectively extend out of the second boundary 902 from the plurality of signal conducting points 320 and connect with the plurality of signal conducting legs. In other words, in the preferred embodiment, all non-signal leads 510 extend to the first boundary 901 from the plurality of non-signal conducting points 310, wherein a portion of the plurality of non-signal leads further extends to the second area 920 without exceeding the second boundary 902. All signal leads 520 extend out of the second boundary 902 from the plurality of signal conducting points 320.

More particularly, as the preferred embodiment shown in FIG. 3, no non-signal leads 510 but only the plurality of signal leads 520 are distributed outside the chip 300 beginning from the second boundary 902. In other words, in the preferred embodiment, unlike the prior arts, the non-signal leads 510 do not "occupy" the space outside the chip 300 beginning from the second boundary 902. Therefore, the space outside the chip 300 beginning from the second boundary 902 is available for the increase in width of the plurality of signal leads 520 to enhance the bent-endurance. The width of the non-signal lead 510 is smaller than or equal to the width of the signal lead 520 in the second area 920. The width of the signal lead 920 in the first area 910 is smaller than or equal to the width of the signal lead 920 in the second area 920. The width of the signal lead 520 in the second area 920 is smaller than the width of the signal lead 520 extending out of the second boundary 902. That is to say, the following relationship holds true: the width of the signal lead 520 extending out of second boundary 902>the width of the signal lead 520 in the second area 920≤the width of the signal lead 520 in the first area 910≤the width of the non-signal lead 510.

The concept of the present invention is to reduce the space occupied by the non-signal leads 510 outside the chip 300 beginning from the second boundary 902 and provide more spare space for the plurality of signal leads 520 to increase the width thereof, thus enhancing the bent-endurance. In the preferred embodiment shown in FIG. 3, no non-signal leads 510 but only the plurality of signal leads 520 are distributed outside the chip 300 beginning from the second boundary 902. In different embodiments, however, a portion of the non-signal leads 510 are allowed to extend out of the second boundary, i.e. at least a portion of the plurality non-signal leads extend to the area between the second boundary and the chip 300. In other words, in different embodiments, the number of the non-signal leads 510 extending out of the second boundary 902 is selectively decreased to reduce the space occupied by the non-signal leads 510 outside the chip 300 beginning from the second boundary 902 and provide more spare space for the plurality of signal leads 520 to increase the width thereof, thus enhancing the bent-endurance.

As the preferred embodiment shown in FIG. 3, the plurality of non-signal leads 510 and the plurality of signal leads 520 are preferably uniformly distributed in the first area 910, wherein the width of the non-signal lead 510 and the width of the signal lead 520 are preferably the same in the first area 910. The width of the signal lead 520 extending out of second boundary 902 is preferably larger than 22 μm. At least one of the plurality of the signal leads 520 has a turning part 521 after extending out of the second boundary 902, wherein the signal lead 520 before the turning part 521 and the signal lead 520 after the turning part 521 include a turning angle θ. More particularly, the signal leads 520 extending out of the second boundary 902 can turn their direction according to the design requirement, for example, to facilitate the distribution of leads.

Figure 4A:
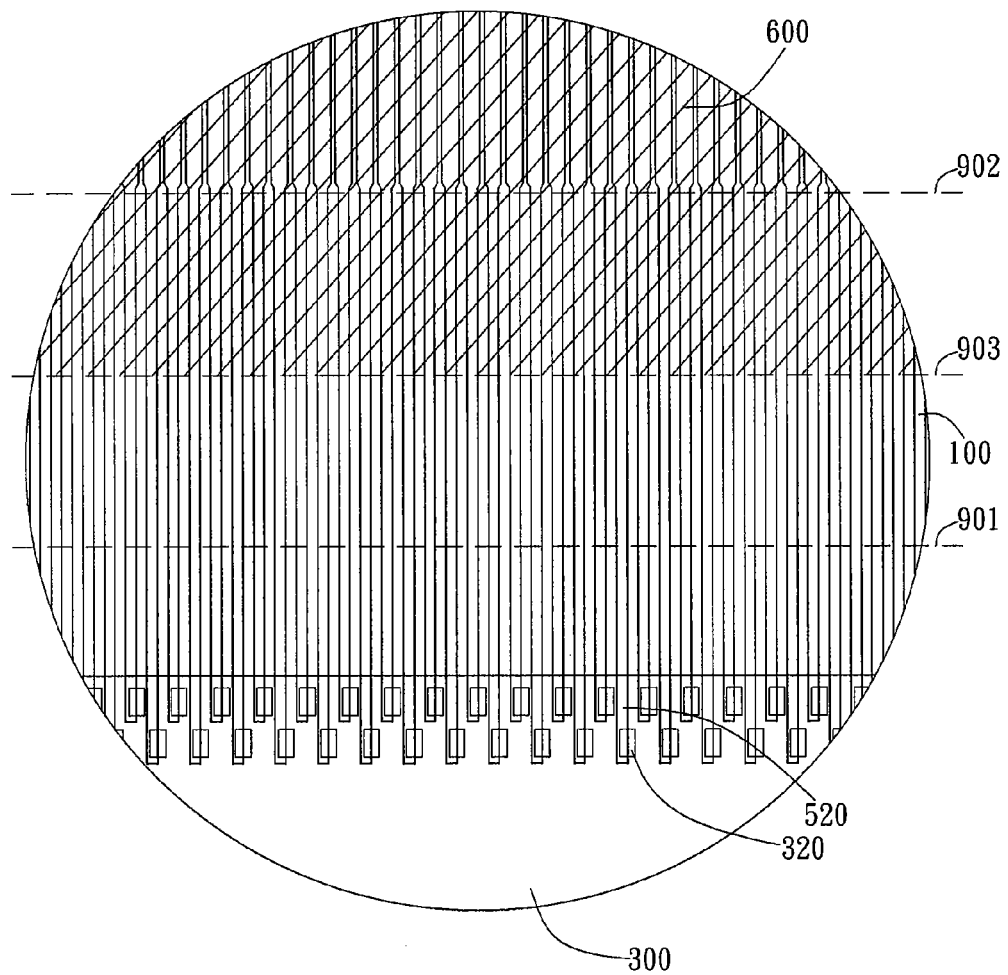
FIGS. 4A and 4B are schematic views of different embodiments of the present invention.
Figure 4B:
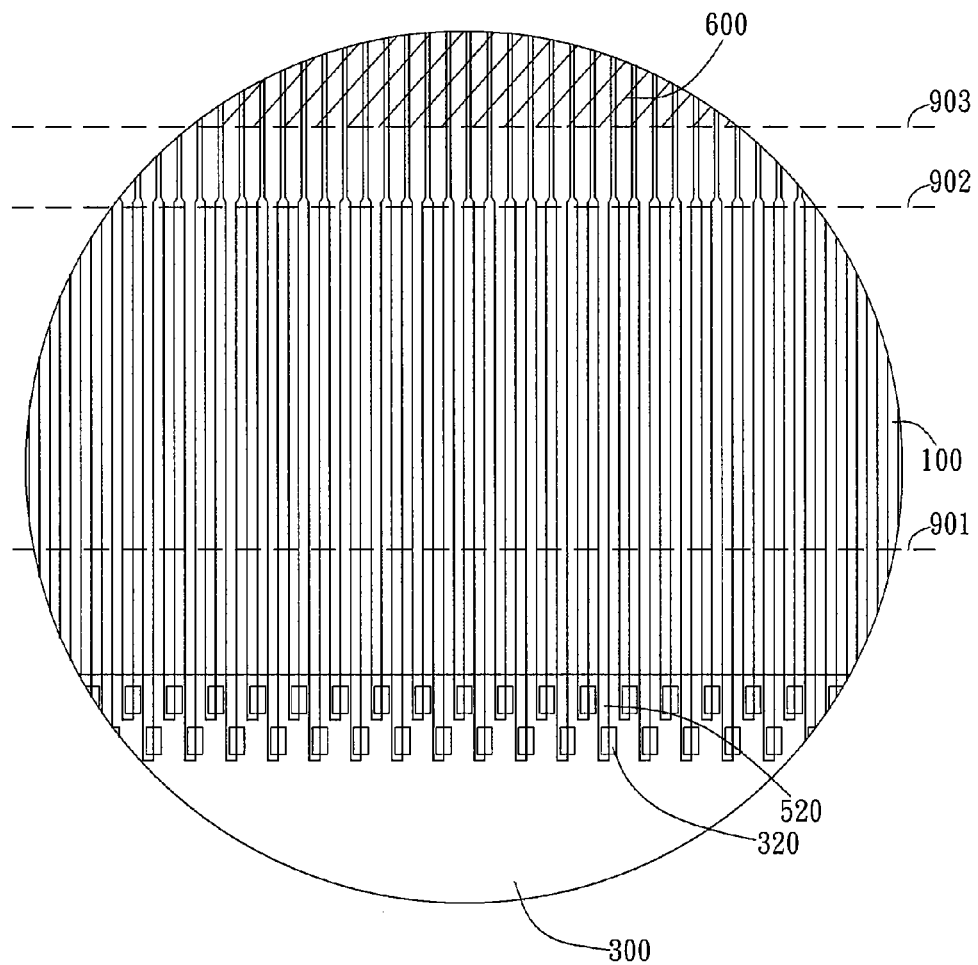

As the embodiment shown in FIG. 4A, a third boundary 903 is defined on the flexible plate 100, wherein the third boundary 903 is between the chip 300 and the second boundary 902. The chip packaging structure further includes an insulating layer 600, wherein the insulating layer 600 at least partially covers the plurality of leads (only the non-signal leads 520 are shown in FIG. 4A) from the third boundary 903 and outward the chip 300. The third boundary 903 is preferably located between the first boundary 901 and the second boundary 902. The insulating layer 600 is preferably a solder resist layer. The distance between the second boundary 902 and the third boundary 903 is larger than 200 μm. In other words, the area covered by the insulating layer 600 is at least 200 μm closer to the chip 300 than the second boundary 200. As shown in FIG. 4B, in a different embodiment, the third boundary 903 is defined outside the second boundary 902 on the flexible plate 100. The insulating layer 600 at least partially covers the plurality of leads (only the non-signal leads 520 are shown in FIG. 4B) from the third boundary 903 and outward the chip 300.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A chip packaging structure for coupling with an external circuit having a plurality of signal conducting legs, comprising:
 a flexible plate;
 a chip disposed on the flexible plate, wherein a first boundary and a second boundary are defined on the flexible plate, the first boundary is located between the chip and the second boundary, a first area is formed between the first boundary and the chip, a second area is formed between the first boundary and the second boundary, the chip including:
  a plurality of non-signal conducting points; and
  a plurality of signal conducting points; and a plurality of leads disposed on the flexible plate, including:
- a plurality of non-signal leads respectively extending out to the first boundary from the plurality of non-signal conducting points and selectively extending to the second area; and
- a plurality of signal leads respectively extending out of the second boundary from the plurality of signal conducting points and connecting with the plurality of signal conducting legs;
- wherein the width of the non-signal lead is smaller than or equal to the width of the signal lead in the second area, the width of the signal lead in the first area is smaller than or equal to the width of the signal lead in the second area, the width of the signal lead in the second area is smaller than the width of the signal lead extending out of the second boundary.

2. The chip packaging structure of claim 1, wherein the plurality of non-signal leads and the plurality of signal leads are equally distributed in the first area, wherein the width of the non-signal lead and the width of the signal lead are the same in the first area.

3. The chip packaging structure of claim 1, wherein the width of the signal lead extending out of second boundary is larger than 22 μm.

4. The chip packaging structure of claim 1, wherein a third boundary is defined on the flexible plate, the third boundary is located between the chip and the second boundary.

5. The chip packaging structure of claim 4, further comprising an insulating layer, wherein the insulating layer at least partially covers the plurality of leads from the third boundary and outward the chip.

6. The chip packaging structure of claim 4, wherein the third boundary is located between the first boundary and the second boundary.

7. The chip packaging structure of claim 4, wherein the distance between the second boundary and the third boundary is larger than 200 μm.

8. The chip packaging structure of claim 1, wherein a third boundary is defined outside the second boundary on the flexible plate.

9. The chip packaging structure of claim 8, further comprising an insulating layer, wherein the insulating layer at least partially covers the plurality of leads from the third boundary and outward the chip.

10. A chip packaging structure for coupling with an external circuit having a plurality of signal conducting legs, comprising:
- a flexible plate;
- a chip disposed on the flexible plate, wherein a first boundary and a second boundary are defined on the flexible plate, the first boundary is located between the chip and the second boundary, a first area is formed between the first boundary and the chip, a second area is formed between the first boundary and the second boundary, the chip including:
- a plurality of non-signal conducting points; and
- a plurality of signal conducting points; and
- a plurality of leads disposed on the flexible plate, including:
- a plurality of non-signal leads respectively extending outward from the plurality of non-signal conducting points, wherein at least a portion of the non-signal leads extend to the area between the second boundary and the chip; and
- a plurality of signal leads respectively extending out of the second boundary from the plurality of signal conducting points and connecting with the plurality of signal conducting legs;
- wherein the width of the non-signal lead is smaller than or equal to the width of the signal lead in the second area, the width of the signal lead in the first area is smaller than or equal to the width of the signal lead in the second area, the width of the signal lead in the second area is smaller than the width of the signal lead extending out of the second boundary.

* * * * *